United States Patent
Jones et al.

[19]

[11] Patent Number: 5,955,704
[45] Date of Patent: Sep. 21, 1999

[54] OPTIMAL PWA HIGH DENSITY ROUTING TO MINIMIZE EMI SUBSTRATE COUPLING IN A COMPUTER SYSTEM

[75] Inventors: Leroy Jones; Robert Petty, both of Austin, Tex.

[73] Assignee: Dell U.S.A., L.P., Round Rock, Tex.

[21] Appl. No.: 08/754,763

[22] Filed: Nov. 21, 1996

[51] Int. Cl.⁶ .............................. H05K 9/00; H05K 1/11
[52] U.S. Cl. .................. 174/262; 174/250; 174/255; 257/698; 257/700; 257/776; 361/794; 361/777
[58] Field of Search .................................. 174/250, 254, 174/257, 261–266, 255; 333/1, 238, 246, 247; 257/691, 692, 694, 698, 700, 750, 758, 776; 361/794, 777, 748

[56] References Cited

U.S. PATENT DOCUMENTS

| | | | |
|---|---|---|---|
| 4,153,988 | 5/1979 | Doo | 29/827 |
| 4,881,116 | 11/1989 | Hidada et al. | 257/700 |
| 5,424,492 | 6/1995 | Petty et al. | 174/250 |

FOREIGN PATENT DOCUMENTS 2-94693  4/1990  Japan .

OTHER PUBLICATIONS

1995 IEEE International Symposium On Electromagnetic Compatibility, Aug. 14–18, 1995.

*Primary Examiner*—Hyung-Sub Sough
*Attorney, Agent, or Firm*—Haynes and Boone, L.L.P.

[57] ABSTRACT

A computer system includes a multi-layer circuit board having first and second routing layers. A component including pads is mounted on the first layer. Crosstalk protection is provided by a plurality of ground vias and signal vias adjacent to the component and extending between the first and second layers. A first circuit trace extends from a first pad along the first layer and between two adjacent ones of the ground vias. A second circuit trace extends from a second pad along the first layer to a signal via at the first layer and from the signal via along the second layer between the two adjacent ground vias.

15 Claims, 3 Drawing Sheets

OPTIMAL PWA HIGH DENSITY ROUTING TO MINIMIZE EMI SUBSTRATE COUPLING IN A COMPUTER SYSTEM

BACKGROUND OF THE INVENTION

The present invention relates generally to high density routing of circuit traces on a printed wiring assembly (PWA) in a computer system and more particularly to reducing electromagnetic interference (EMI) by providing crosstalk protection between the traces.

One of the greatest challenges of designing PWAs for Electro-Magnetic Compliance (EMC) is providing a means of isolation between noisy components and the rest of the board. Noisy components contaminate the multi-layer substrate with unwanted high frequency noise through a mechanism known as crosstalk coupling, which must be controlled in order to achieve compliance. The most popular method of providing this isolation is through a technique known as "moat & bridge" whereby a channel (moat) surrounding the component of interest is formed by removing the copper from the board surface around the component except for a small area known as the bridge. This absence of copper is mirrored on all layers of the PWA. At the entrance to the bridge, defined by terminal ends of the moat, ground vias are placed on both sides in order to draw high frequency currents to the ground plane prior to their entrance into or out of the protected area.

One of the design parameters that must be followed in order for the moat & bridge technique to work is that all signals to and from the device must cross over the bridge only. Additionally, no other signals may cross the moat on any other layer of the board. Running signals across the moat defeats its purpose and can even cause worse emission problems than not moating at all. Therefore, this technique is only feasible when a small number (typically less than 20) of circuit traces must interface the noise producing component such as in the case of a clock generator.

A problem occurs when very large scale integrated circuits (VLSIC) are noisy. VLSICs often have over one hundred circuit traces that must interface the device. The moat & bridge technique is not a practical option in this situation because there are too many traces to fit in the small bridge area, and a moat is too restrictive from a routing standpoint because the traces fan out in all directions around the component. Unfortunately, a suitable solution to the problems associated with unwanted high frequency noise has not been satisfactorily addressed by the prior art.

Therefore, what is needed is an apparatus and a method for the high density routing of circuit traces whereby crosstalk protection is provided to reduce electro-magnetic interference.

SUMMARY OF THE INVENTION

The present invention accordingly, provides an apparatus and method for providing crosstalk protection in a computer system. To this end, a multi-layer circuit board is provided including first and second routing layers. A ground plane is provided between the first and second layers. A component including pads is mounted on the first layer. Ground vias and signal vias extend between the first and second layers. A first circuit trace extends from a first pad along the first layer between two adjacent ground vias. A second circuit trace extends from a second pad along the first layer to a signal via and extends from the signal via along the second layer between the two adjacent ground vias.

A principal advantage of the present invention is that a series of EMI quiet bridges are provided by which high density routing of circuit traces are accommodated. These traces extend outwardly from the periphery of the component. This is in contrast to prior art routing arrangements utilizing the moat and bridge technique which accommodates only a limited number of circuit traces concentrated in the bridge area defined by the terminal ends of the moat.

DESCRIPTION OF THE PREFERRED EMBODIMENT

Figure 1:
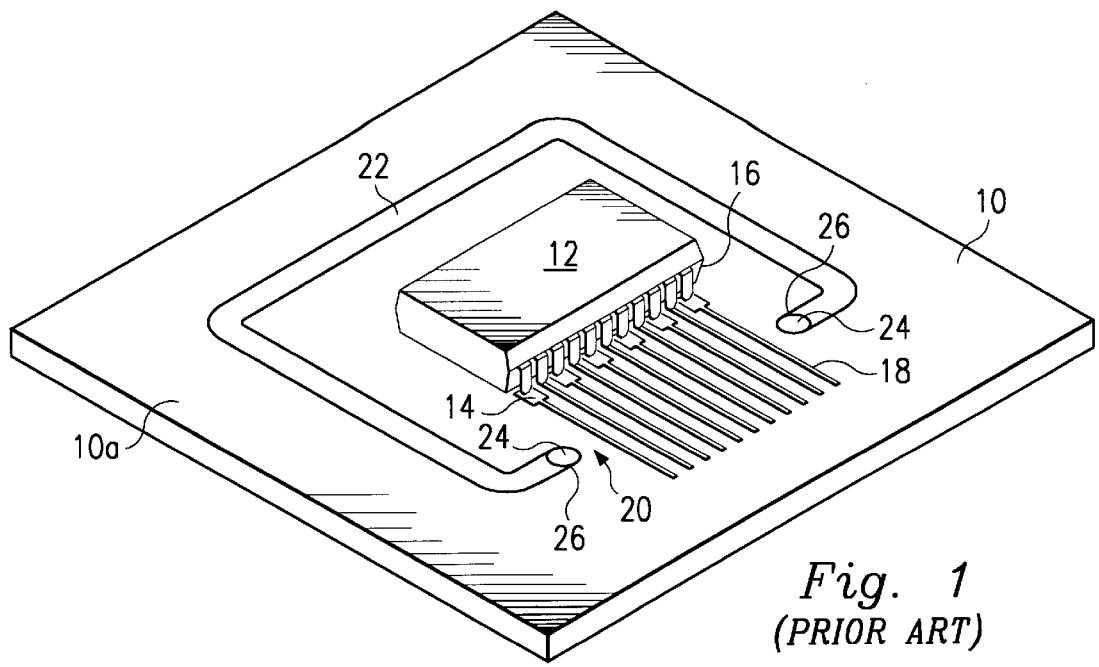
FIG. 1 is an isometric view illustrating the prior art moat and bridge technique.

Referring to FIG. 1, illustrated is a prior art moat and bridge arrangement including a circuit board generally designated 10 having a component 12 mounted thereon. Component 12 includes pads 14 connected to a peripheral edge 16. The pads 14 are connected to circuit traces 18 which extend therefrom across a bridge 20. A moat 22, comprising a channel formed by removing copper from all layers of board 10 including surface 10a, substantially surrounds component 12, and includes terminal ends 24 coinciding with a pair of spaced apart ground vias 26 which define bridge 20.

Figure 2:
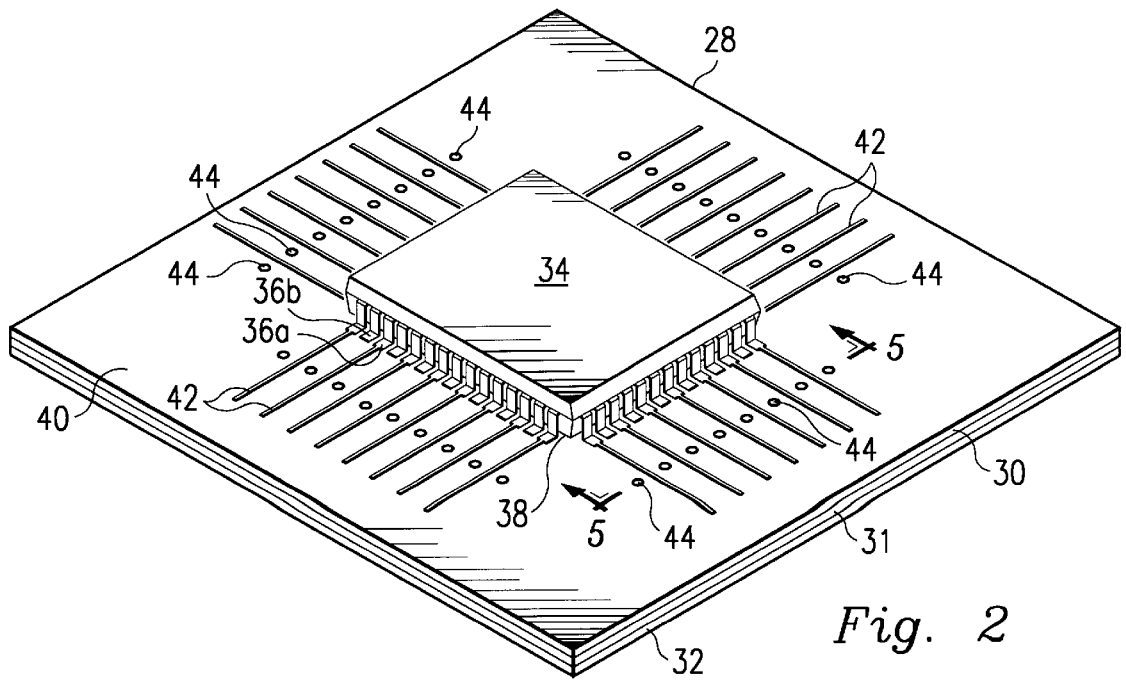
FIG. 2 is an isometric view illustrating an embodiment of circuit traces extending outwardly between ground vias according to the present invention.
Figure 2A:
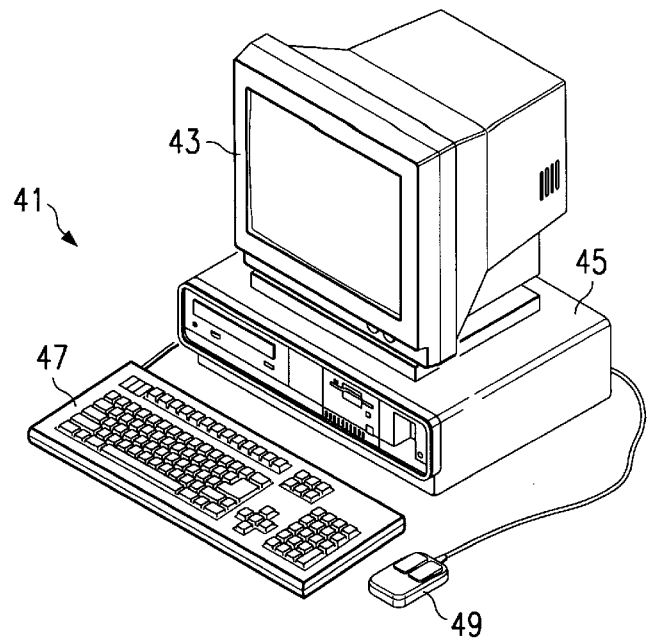
FIG. 2a is a diagrammatic view illustrating an embodiment of a computer system in which the present invention can be utilized.

FIG. 2 illustrates a multi-layer circuit board 28 including a first layer 30, a second layer 32 and a ground plane 31 therebetween. A component 34 is mounted on first layer 30 and includes a plurality of pads 36a, 36b extending from a continuous peripheral edge 38 of component 34. Pads 36a, 36b rest on a surface 40 of first layer 30. A plurality of first layer signal traces 42 extend outwardly from alternate ones 36a of the pads. Traces 42 extend along surface 40 of first layer 30 and between adjacent ones of a plurality of ground vias 44 which are outwardly spaced from pads 36a, 36b. Circuit board 28 including component 34 is of the type utilized, for example, in a computer system 41 such as is diagrammatically illustrated in FIG. 2a including a monitor 43, a CPU 45, a keyboard 47 and a mouse 49.

Figure 3:
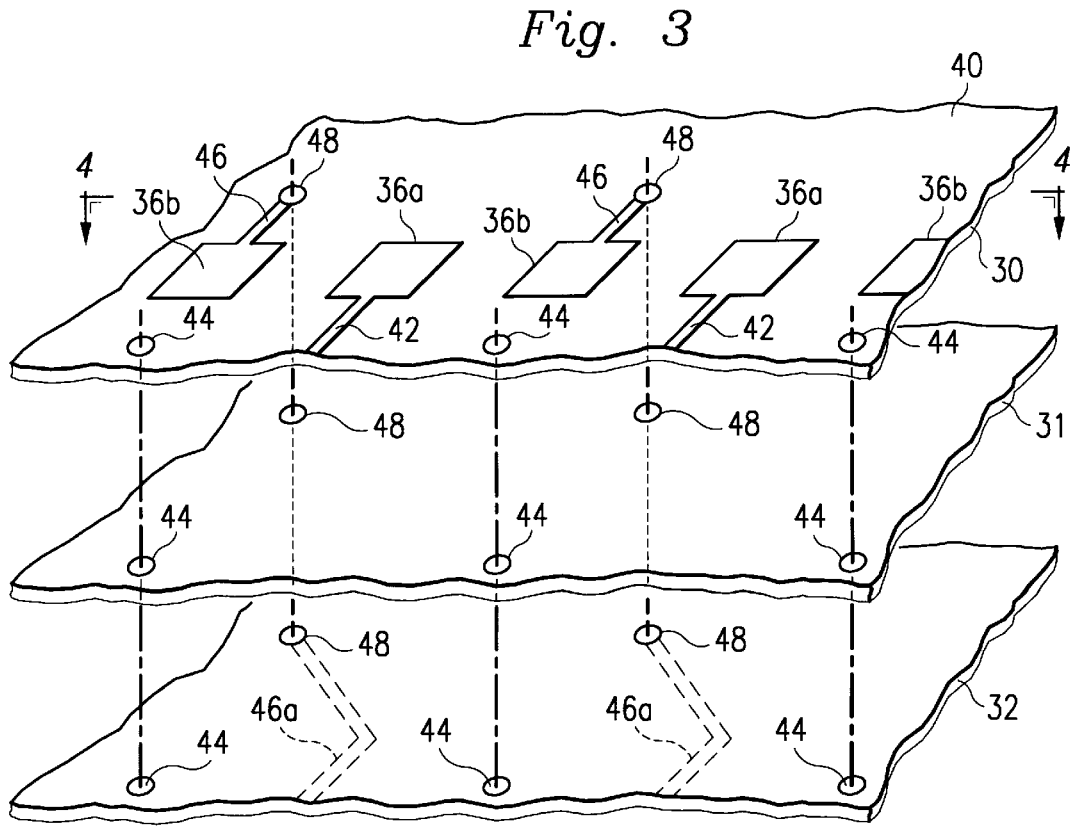
FIG. 3 is an isometric view diagrammatically illustrating an embodiment of vertically stacked circuit traces extending between ground vias according to the present invention.

FIG. 3 illustrates first layer 30 including pads 36a and first traces 42 extending therefrom. A plurality of signal vias 48 pass through ground plane 31 and extend from first layer 30 to second layer 32. The plurality of ground vias 44 also pass through ground plane 31 and extend from first layer 30 to second layer 32. Another plurality of first layer signal traces 46 extend from pads 36b along first layer 30 to signal vias 48, then extend from signal vias 48 at second layer 32 as second layer traces 46a along second layer 32 between the previously mentioned adjacent ones of ground vias 44. It is shown in FIG. 3 that the first layer traces 42 and second layer traces 46a are vertically stacked and spaced from one another.

Figure 4:
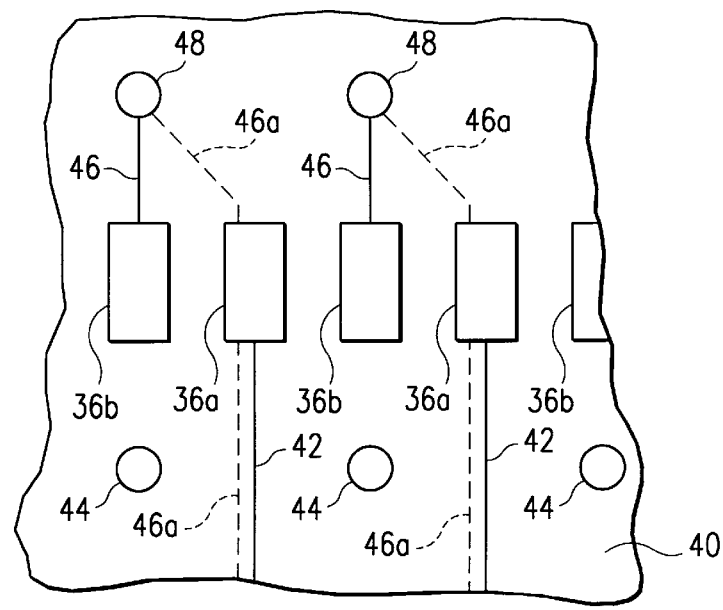
FIG. 4 is a planar view diagrammatically illustrating an embodiment of stacked circuit traces extending between ground vias as viewed along line 4—4 of FIG. 3.

FIG. 4 illustrates in planar view, the side-by-side pads 36a, 36b and traces 42 extending along surface 40 between adjacent ones of ground vias 44. Traces 46 extend from alternate others 36b of the pads to a respective signal via 48 adjacent pads 36b. As illustrated in phantom, traces 46a also extend from signal vias 48 along second layer 32 and between the adjacent ones of ground vias 44.

Figure 5:
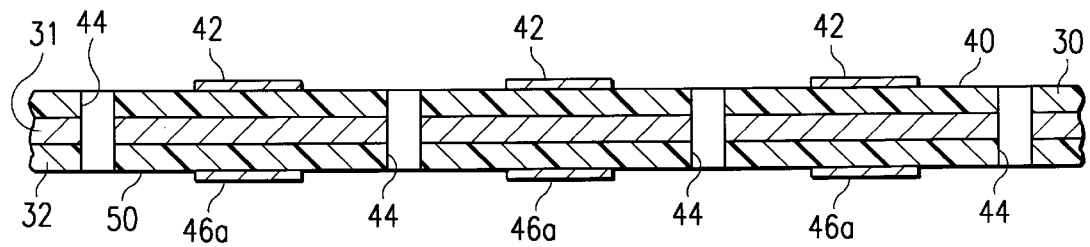
FIG. 5 is a partial cross-sectional side view illustrating an embodiment of vertically stacked circuit traces extending between ground vias as viewed along line 5—5 of FIG. 2.

In another cut-away view, FIG. 5 illustrates first layer 30 including surface 40 having traces 42 thereon. Ground vias 44 extend through ground plane 31 from first layer 30 to second layer 32. Traces 46a are on a surface 50 of second layer 32.

It is understood that several variations may be made in the foregoing without departing from the scope of the invention. It is possible, in accordance with the present invention, to provide a six layer stack-up, and an eight layer stack-up, for example. Multiple vertically stacked signals are serviced by shared ground vias 44, extending through the multiple layers of board material and ground plane. The typical spacing between pads 36a, 36b of a high density VLSIC is 25 mils. The vias 44 are placed on 50 mil grid, center-to-center. The vias 44 have a diameter of 30 mils. This leaves 20 mils between each adjacent via 44 which is enough room to run a 7 mil wide trace between vias 44 and still leave adequate spacing from the vias 44.

In operation, a circuit trace extends from one pad along the board surface between two adjacent ground vias. Another circuit trace extends from an adjacent pad to a signal via which carries the trace to a vertically stacked board level so that the second named trace can extend along the stacked board surface and be vertically spaced from the first named trace and also extend between the same adjacent ground vias.

As it can be seen, the principal advantage of the present invention is that the moat and bridge technique can be simulated without the need for the moat, i.e. a series of EMI bridges are created by which high density routing requirements may be accommodated. Thus, the tightly spaced array of vias simulate the moat. The limitations of the moat and bridge technique, with regard to the limited number of traces that can be accommodated, are overcome.

Although illustrative embodiments of the invention have been shown and described, a wide rage of modification, change and substitution is contemplated in the foregoing disclosure and in some instances, some features of the present invention may be employed without a corresponding use of other features. Accordingly, it is appropriate that the appended claims be construed broadly and in a manner consistent with the scope of the invention.

What is claimed is:

1. A computer system comprising:
    a multi-layer circuit board including first and second layers for routing signals;
    a ground plane between the first and second layers;
    a component including first and second side-by-side pads mounted on the first layer;
    a ground via on a first side of each second pad connecting the ground plane with the first and second layers;
    a signal via on a second side of each second pad opposite the first side, each signal via extending from the first layer to the second layer;
    a first circuit trace extending in a first direction from each first pad along the first layer between two adjacent ones of the ground vias; and
    a second circuit trace extending in a second direction from each second pad along the first layer to the signal via at the first layer, extending from the signal via along the second layer in the first direction, and extending between two adjacent ground vias, so that the first and second traces are in stacked relationship on opposite sides of the board.

2. The computer system as defined in claim 1 wherein the second circuit trace extending from the signal via along the second layer and between the two adjacent ground vias is substantially parallel to and vertically spaced from the first circuit trace.

3. The computer system as defined in claim 1 wherein the first circuit trace is on a surface of the first layer spaced from the ground plane, the second circuit trace extending from the signal via being on a surface of the second layer spaced from the ground plane.

4. The computer system as defined in claim 1 wherein the component includes a continuous peripheral edge and the pads extend from the edge.

5. The computer system as defined in claim 4 wherein the ground vias are spaced outwardly from the peripheral edge of the component.

6. The computer system as defined in claim 5 wherein the signal via is adjacent the peripheral edge of the component.

7. A computer system having crosstalk protection comprising:
    a multi-layer circuit board having first and second layers for routing signals;
    a ground plane between the first and second layers;
    a component including first and second-side-by-side pads mounted on the first layer, the component having a continuous peripheral edge and each pad extending from the edge;
    a ground via on a first side of each second pad connecting the ground plane with the first and second layers;
    a signal via on a second side of each second pad opposite the first side, each signal via extending from the first layer to the second layer; and
    a plurality of circuit traces extending from the peripheral edge of the component, first ones of the circuit traces extending in a first direction from each of the first pads along the first layer between adjacent ones of the ground vias, and second ones of the circuit traces extending in a second direction from each of the second pads along the first layer to a respective adjacent signal via at the first layer, extending from the respective signal via at the second layer and along the second layer in the first direction, and extending between the adjacent ones of the ground vias.

8. The computer system as defined in claim 7 wherein the ground vias are provided in an array spaced outwardly from the peripheral edge of the component.

9. The computer system as defined in claim 8 wherein the signal vias are provided in an array adjacent the pads.

10. The computer system as defined in claim 9 wherein the second circuit traces extending from the signal vias along the second layer and between the adjacent ones of the ground vias are substantially parallel to and vertically spaced from the first circuit traces.

11. The computer system as defined in claim 7 wherein the first ones of the circuit traces are on a surface of the first layer spaced from the ground plane, the second ones of the circuit traces extending from the respective signal via, are on a surface of the second layer spaced from the ground plane.

12. In a computer system, a method of providing crosstalk protection comprising the steps of:
    mounting a component including first and second side-by-side pads on a first layer for routing signals of a multi-layer circuit board;

providing a ground plane between the first layer and a second layer for routing signals;

providing a ground via on a first side of each second pad connecting the ground plane with the first and second layers of the board;

providing a signal via on a second side of each second pad opposite the first side, each signal via extending from the first layer to the second layer of the board;

extending a first circuit trace in a first direction from each first pad along the first layer between two adjacent ones of the ground vias; and extending a second circuit trace in a second direction from each second pad along the first layer to an adjacent signal via at the first layer, extending from said signal via at the second layer along the second layer in the first direction, and extending between two adjacent ground vias.

13. The method of providing crosstalk protection as defined in claim 12 wherein the step of providing a plurality of ground vias includes the step of arranging the ground vias in an array extending around a peripheral edge of the component.

14. The method of providing crosstalk protection as defined in claim 13 wherein the step of providing a plurality of signal vias includes the step of arranging the signal vias in an array adjacent the pads.

15. The method of providing crosstalk protection as defined in claim 14 wherein the step of extending the second circuit trace along the second layer includes the step of spacing the second circuit trace vertically from the first trace on the first layer.

\* \* \* \* \*